United States Patent [19]

Quella et al.

[11] 4,298,802
[45] Nov. 3, 1981

[54] METHOD AND DEVICE FOR COLLECTING LIGHT UTILIZING A LIGHT TRAP

[75] Inventors: Ferdinand Quella; Heinz Pape, both of Munich, Fed. Rep. of Germany

[73] Assignee: Siemens Aktiengesellschaft, Berlin & Munich, Fed. Rep. of Germany

[21] Appl. No.: 125,496

[22] Filed: Feb. 28, 1980

[30] Foreign Application Priority Data

Mar. 6, 1979 [DE] Fed. Rep. of Germany ....... 2908770

[51] Int. Cl.³ .......................... H05B 33/00; G01J 1/58
[52] U.S. Cl. .................................... 250/484; 250/486
[58] Field of Search ................ 250/483, 484, 486, 487

[56] References Cited

U.S. PATENT DOCUMENTS

| | | | |
|---|---|---|---|
| 2,243,828 | 5/1941 | Leverenz | 250/486 |
| 4,110,123 | 8/1978 | Goetzberger et al. | 136/89 HY |
| 4,142,781 | 3/1979 | Baur et al. | 350/345 |
| 4,149,902 | 4/1979 | Mauer et al. | 250/486 |
| 4,205,116 | 5/1980 | Van Landeghem et al. | 250/483 |

OTHER PUBLICATIONS

Paul B. Mauer et al., "Fluorescent Concentrator for Solar Energy Collection", *Research Disclosure*, Jan. 1975, No. 129, pp. 20–21.

A. Goetzberger et al., "Solar Energy Conversion with Fluorescent Collectors", *Applied Physics*, vol. 14, 1977, pp. 123–139.

G. Keil, "Design Principles of Fluorescent Radiation Converters", *Nuclear Instruments and Methods*, vol. 87, 1970, pp. 111–123.

W. Greubel et al., "Das Fluoreszenz-Aktivierte Display 'FLAD'", *Elektronic*, vol. 6, 1977, pp. 55–56.

K. H. Drexhage, *Dye Lasers*, 1977, pp. 172–179.

*Primary Examiner*—Alfred E. Smith
*Assistant Examiner*—Janice A. Howell
*Attorney, Agent, or Firm*—Hill, Van Santen, Steadman, Chiara & Simpson

[57] ABSTRACT

A method and a device for collecting light characterized by a body which acts as a light trap, contains at least two different groups of fluorescent particles with each group having an absorption range and light emitting range which are different from the other groups, and has at least one light decoupling window to emit the fluorescent light therefrom.

28 Claims, 2 Drawing Figures

METHOD AND DEVICE FOR COLLECTING LIGHT UTILIZING A LIGHT TRAP

BACKGROUND OF THE INVENTION

The present invention is directed to a method for collecting light which utilizes a body functioning as a light trap, the body preferably is designed in plate shape and consists of a solid polymerized synthetic carrier containing fluorescent particles and is provided with at least one light exit window.

A light collector utilizing a body containing fluorescent particles or pigments is known in a various number of embodiments. For example, it may be used for collecting solar energy as disclosed in U.S. Pat. No. 4,110,123, which was based on German O.S. 26 20 115. Two other examples of such a solar collector used for capturing solar energy are disclosed by Paul M. Mauer et al, "Fluorescent Concentrator for Solar Energy Collection", *Research Disclosure,* January, 1975, No. 129, pages 20 and 21, and Goetzberger et al, "Solar Energy Conversion with Fluorescent Collectors", *Applied Physics,* Vol. 14, 1977, pages 123-139. Collectors, which utilize fluorescent particles, have also been used for optical transmission of messages as disclosed in copending U.S. Pat. application Ser. No. 932,569, which issued as U.S. Pat. No. 4,222,880 on Sept. 16, 1980 and is based on German application P 27 42 899, and for brightening the image of a passive display, as disclosed in both U.S. Pat. No. 4,142,781 which includes the disclosure of German O.S. 25 54 226 and in an article by W. Greubel et al, *Elektronik,* Vol. 6, 1977, pages 55 and 56. Collectors have also been used for increasing the sensitivity of a scintillator as disclosed by G. Keil, "Design Principles of Fluorescence Radiation Convertors", *Nuclear Instruments and Methods,* Vol. 87, 1970, page 111-123. Favorable processing conditions, carrier materials and possibilities for improving the light yields have already been described in copending U.S. application Ser. No. 062,816, which is based on German application P 28 33 914.2; U.S. Ser. No. 062,734 which is based on German application P 28 33 926.6 and U.S. Ser. No. 062,784 which was based on German application P 28 33 934.6.

When light strikes a fluorescent plate, then the component of the light lying in excitation spectrum of a fluorescent substance is absorbed by the fluorescent centers of the materials. The remaining light component will permeate the fluorescent plate undisturbed. The absorbed radiation is emitted by the fluorescent centers with a longer wave length and spatially undirected. Due to reflections at the plate interface a large part of the fluorescent light is conducted in the interior of the carrier plate until it emerges at specific coupling out regions with an increased intensity.

The efficiency achieved up until now with fluorescent plates still always lags behind the theoretical possible values. Mainly this is because the emission spectrum overlaps with the absorption spectrum and the fluorescent radiation of the plate therefore has a finite absorption length. What is particularly dissatisfying is that this "self-absorption" has a particularly unfavorable effect particularly on fluorescent bodies with a large collecting surface.

It has already been known for a long time that the emission band is displaced towards the lower frequencies with respect to the excitation band in some organic fluorescent substances when these particles are dissolved in a liquid with a strong orientation polarization. In the following it will be understood that pigments are unsolved or unsoluble dyes. Whereas particles are molecules solved in a liquid or a carrier. This displacement, which is known as a red shift occurs when the fluorescent molecule has different dipole moments in its basic or at rest state and its excitation state and when the environment which remains unchanged during the absorption process can re-orient during the existence of the excitation state as described in an article by E. Lippert, Zeitschrift für Elektrochemie, Ber. Bunsengs. Phys. Chem. Vol. 61, No. 8, 1957, pages 962-975.

However, fluorescent bodies should consist insofar as possible of a solid carrier material. Solid carriers, which are organic synthetics, can be manufactured and processed with relatively low outlay which is an advantage, particularly in a mass production process.

The desired band separation in solid state solution also depends on the dielectric constant of the solid and the dipole differences between the rest state and the excited state also plays an important role. This is discussed in the above mentioned article from *Applied Physics.* Investigations of the suggested interrelationship which leads further and which investigation would teach one how to select the synthetics with the necessary polarization properties, are stil lacking. Above all, there is a lack of suggestion as to how one is to proceed so that the polar synthetics also fulfills the demands to be made of the fluorescent bodies. The fluorescent body, as well known, must be highly transparent and thermally as well as photochemically stable. In addition, the fluorescent bodies should be easy to bring into any desirable shape, must be hard and dimensionally stable in the final state, and should have a high fluorescent quantum yield.

SUMMARY OF THE INVENTION

The present invention is directed to providing a fluorescent body in the simplest possible manner, which body has the good properties of the known fluorescent bodies, and in contrast to the previously known fluorescent bodies can provide a higher light yield, and can have either a higher life expectancy or a variation in the color that is emitted or both.

To accomplish these tasks, the present invention is directed to an improvement in the method for collecting light which method comprises providing a body functioning as a light trap, said body containing fluorescent particles or pigments having an absorption range and emits light in an emission range, said body having at least one light decoupling window. The method includes absorbing light waves in the absorption range of the particles and emitting light in the emission range with the improvement comprising providing a second fluorescent particle or pigment having an absorption range and an emission range different than the ranges of said first mentioned particles and absorbing light in both ranges and emitting light in the two emission ranges. In one embodiment of the invention, the second fluorescent particles have an emission range extending beyond the absorption range of the first particles and during the step of absorbing, the absorption range of said second particles increases the brightness at the exit window by providing light of two distinct ranges. In another embodiment, the second fluorescent particles absorb light in a shorter wave length than the absorption range of the first fluorescent particles and at least a portion of the emitted light of the second particles is in the absorption range of the first fluorescent particles. An additional or third fluorescent particle may be in the body and the third particle will absorb shorter light wave length components of the fluorescent light emitted by the first fluorescent particle and thus the third particles will displace the emitted light to a longer wave length by emitting light with a longer wave length.

The invention of each embodiment proceeds from the consideration that frequently only one part or range of the available ambient light such as sunlight or incandescent light would be of interest in a particular device. Thus, for example, in the "fluorescence-activated display" discussed in the above mentioned article in *Elektronik*, the colors yellow and yellow-green which are practically well suited to be perceived by the eye are interesting for display. However, in many cases, for example, during twilight or under cloud cover, only small amounts of the available light is in the absorption range of a yellow fluorescent activated display.

The invention provides a solution by which the range of the component of the light available for the brightness of the display is increased and a life expectancy of the fluorescent body is also extended. This occurs by providing second fluorescent particles which absorb light at a range of shorter wave lengths than the first mentioned particles. The second fluorescent particles have an emission range which more or less completely overlaps with the absorption range of the first fluorescent particles. Thus, in addition to the normal absorbability light portion in the ambient light, the light displaced by the second fluorescent particles into the absorption wave length range of the first fluorescent particles is also available to the first fluorescent particles.

In one of the embodiments as mentioned hereinabove, the brightness is increased by means of the second fluorescent particles having an emission range which lies outside the absorption range of the first fluorescent particles to a significant degree. Thus, the emitted light, which is coupled out of the coupling windows, is of a greater intensity and is formed by two different ranges of emitted light.

In a further embodiment of the invention, the second fluorescent particle has the same chemical environment as the first fluorescent particles, for example, pure carrier material or polar environment, or has chemical properties which are compatible with the chemical property of the first fluorescent particles so that there is no conflict therebetween. In this manner, an indisrupted intermixture can be provided in the fluorescent plate material.

The concentration of each of the fluorescent particles according to the invention is selected in such a manner that the light from the wave length range of the ambient light to be absorbed by the particles will be absorbed in a range of 90 and 100%. Therefore, the device will completely exploit the ambient light that enters the fluorescence plate and still the automatic obliteration is kept as small as possible. In advantageous cases, the fluorescent molecules of the second fluorescent particles represent light sources for the first which sources are uniformly distributed in the carrier. By so doing, the effect of "light consumption", which normally occurs and which increases as the distance from the surface of the plate to the particular position of the particles increases, is absolutely reduced in comparison to the traditional fluorescent plates.

According to a further development of the invention, the concentration of particles is selected to be dependent on the length of travel of the light in the plate and on the life expectancy of the particles. If the decomposition products of the particles do not effect or significantly prejudice the optical properties of the system, the concentration of one of the two particles can be increased up to a point of self-obliteration of the fluorescent material. By so doing, the life expectancy of the fluorescent plate is increased despite the constant decomposition of the particular particles.

An intermixture of the particles in the same carrier plate is not always possible. According to further execution of the invention, the second fluorescent particles can be embedded in the carrier material by alterations of a portion of the carrier material such as by altering possible additive components of the carrier material. In addition, it can be embedded in a different or separate carrier. When a second carrier is used, there are the advantages that no particular high optical demands are placed on the second carrier and that one can combine particles which would otherwise be incompatible in a single carrier. It is noted, that the term plate or "fluorescence plate" is not meant to be limited solely to single plate but can also include an entire fluorescent body of any geometric shape.

Since the second particles absorb light having a shorter wave length, the second layer or carrier only effects the light intensity of the shorter wave lengths. Of course, the carrier material for the auxiliary or the second particles must be as supertransparent as possible for the range of light wave lengths which are in the absorption range of the first fluorescent particles.

Nonetheless, the demand on the optical quality of the second carrier materials are not as high as for the materials of the actual first fluorescence plate or carrier member. This is due to the fact that the layer thickness and the travel distance of the partially multiply totally reflected light in a medium which is optically less favorable, can be made as small as possible in the carrier for the second fluorescent particles.

If the transmission in the wave length range of absorption of both fluorescent particles is sufficient, then according to a further inventive feature, materials of the index of refraction $n \approx 1$ are also employed for the additional layer. In this case, the totally reflected light proceeds almost entirely in the display color plate, whereby the second layer is removed at the coupling-out locations. By employing materials for the additional layer with an index of refraction $n \approx 1$, the number of exploitable carrier materials from the groups of synthetics and glass can be increased.

In addition to the additional gains of brightness in displays, this arrangement has other advantages. In the case of energy conversion from captured solar energy, for example as disclosed in the article by Goetzberger, one can make do with fewer different particle carriers and fewer solar cells and still cover the entire range of the spectrum of the sunlight.

The proposed arrangement also becomes interesting because solar cells suitable for exploiting the entire spectrum of the sunlight have not yet been offered or have not been brought to technical fruitation. Up to now, silicon cells are primarily employed. If one also shifts additional regions of the sunlight spectrum into the working region of the solar cells, the energy yield would have a significant increase.

In carrier materials for fluorescent particles, one knows of the phenomenon that the absorption and emission bands of the fluorescent particles overlap and that light is lost due to self absorption in the overlapping range. Methods for the separation of the absorption and emission bands by means of embedding the particles in a polar environment have been specified in the above mentioned U.S. applications Ser. Nos. 062,734, 062,784 and 062,816. A significant increase in the yield of the emitted light was achieved particularly when the polar additive has a high viscosity, see K. H. Drexhage, "Structure and Properties of Laser Dyes" *Dye Lasers* E. Schäfer (Editor), Springer Verlag 1973, page 173. Since the admixture of the polar additives, however, means a significant cost, it ought to suffice in some cases to increase the total offering of light in the particular desired range only by means of the addition of a second fluorescent particle without the polar additive. The emission light component lost due to self-absorption is then counterbalanced by the additional light offered.

According to further development of the invention, the carrier material which is utilized, exhibits a transparency in the ultraviolet range. Some types of commercially available material such as technical PMMA (polymethylmethacrylate) represents such a carrier material. It is transparent to ultra violet light beginning at wave lengths $>250$ nm.

Light with wave lengths $\leq 400$ nm is considered extremely harmful to the particles and carrier substances and will also lead to a rapid aging of the arrangement. According to the invention, the concentration of the second fluorescent particles is selected in such a manner that it absorbs as largely as possible in the range between 250 and 400 nm. In this manner, the second, or added fluorescent particles also has the function of protecting against aging of the device and is known as an ultraviolet absorber.

The ultraviolet protection is not only effective against the destructive influence of the ultraviolet light, such as chain cleavage, but it also is effective against oxidation which will have an effect on the fluorescent particles and carrier. Oxygen, which is always present, and ultraviolet light ($\lambda \leq 400$ nm) effects high energy, greatly oxidizing excitation states which are largely avoided by means of the ultraviolet protection. In the framework of the invention, therefore, means for preventing oxidation are also added to the carrier material in addition to the ultraviolet protection. The means for ultraviolet protection or the means for preventing oxidation and their reaction products with oxygen are transparent for the emission light. Oxygen quenchers, for example in the form of tertiary amines, preferably diazobycyclo-octane, are taken into consideration as a means for preventing oxidation.

According to a further development of the invention, the means for preventing oxidation is simultaneously a polar solvent for the fluorescent particles. By utilizing this type of means for preventing oxidation, one can better separate the absorption and emission ranges of the particular particle.

Since the second fluorescent particle requires the same chemical environment as the first particle or must at least be compatible therewith, and the fact that the second particles cannot prejudice the first particles, concentrations of the second or additional fluorescent particle is selected to such a high degree that the ultraviolet light is already completely absorbed in the proximity of the surface. Thus ultraviolet light will have a very low penetration depth into the carrier plate or body.

As already explained, an intermixture of the particles in the same carrier is not always possible, but embedding the auxiliary particles in the carrier material while changing possible additive components in another carrier is possible. This is also true when high concentration of the second fluorescent substance either creates a disruption in the optical properties of carrier material or of the primary particles, but the carrier composition is nonetheless identical.

According to a further development of the invention, the emission range of the second fluorescent particles and the absorption range of the first fluorescent particles do not overlap, so that a mixed color arises from the two fluorescent colors. The overall intensity of the mixed colors will depend on the particular share of each of the respective emission lights.

According to a further development of the invention, the chrominance of the fluorescence plate is varied by means of the mixing ratio of the particles. Moreover, the fluorescent light can be coupled out through colored, fluorescing or nonfluorescing pigments. Color variations can also be achieved by selecting the pigments at the exit windows. It is also possible to vary the color and intensity of the light coupled out when there exists no overlapping of the emission bands of one of the fluorescent particles and the absorption bands of the other fluorescent particles. Thus, the addition of the two fluorescent colors emitted by the two different fluorescent particles will represent an increase of the overall intensity of the fluorescent light.

According to a further development of the invention, a device for implementing the method will involve a fluorescent body containing the various different fluorescent particles and having exit windows for the coupling of fluorescent light which windows are formed by a reflective notch on one surface associated with a scattering element positioned on the opposite surface. In addition, colored or fluorescent pigments may be utilized as part of the scattering elements. Beyond that, the fluorescent pigments for changing the chrominance of the fluorescent light are introduced at the plate edge.

Coming into consideration above all as the second, additional fluorescent subject are such substances as generally employed as "whiteners" and optical brighteners as disclosed by A. Wagner, *Naturwissenschaften*, vol. 55 (1968), pages 533–538. In terms of their absorption and emission behaviors, these substances still leave sufficient space in the visible spectrum for a second fluorescent substance.

Following organic synthetics can expediently be utilized as the carrier material. These are fluorescent bodies are select and are of a carrier materials selected from a group of materials consisting of cellulose derivatives, polyacrylates, polymethylmethacrylates, polystyrenes, polycarbonates silicone resins with polar groups, copolymers of styroles as a main component and copolymers of methylmethacrylate as the main component. An example of a cellulose derivative is cellulose-acetobutyrate. An example of a copolymer with styrene is poly(styrene-co-butadiene) and an example of a copolymer with methylmeethacrylate is poly(methyl-methacrylate-co-acrylonitrile). A lot of this copolymers both of styrene and methylurethacrylate are decribed in Polymer Handbook, Brandrup, Immergut (editors), Wiley Interscience, 1975, pages II248-259 and pages II-303-333. If the concentration of the comonomer in the copolymer is small (below 10%) it is according to experience that nearly all are highly transparent. Most of them are transparent to a higher concentration of the co-monomer. Exact data about the transparency of this copolymers are not available.

The fluorescent bodies of the inventive device can be manufactured in various ways. One may proceed economically with an injection molding method or an extrusion technology or one can cast the body. Thereby, the polar additives can either be mixed with an non-cross-linked polymer in an extruder or one may mix the additives with the monomer and subsequently polymerizes the mixture. One manufactures the body by means of a casting technique, then the polymer need not be a thermoplastic and as in the case of casting resins, this can be cross-linked during the polymerization.

A few polymer-additive pairings mix well at higher temperatures but given a little cooling, tend to partially crystallize out in one or both components. To counter this feature, one can quickly bring the mixture from a high temperature to a low temperature, so that an amorphous vitreous state is frozen into the body. Such a quick cooling process, for example, is accomplished by utilizing injection molding machines, where the molds are usually held at a temperature of approximately 60° celsius.

The final products manufactured in the manner described exist in the following modifications. They are either thermoplastic synthetics with polar-organic additives in a solute or chemically bonded form or, on the other hand, cross-linked thermoplastic synthetics with polar-organic additives which are likewise solute or chemically bonded.

DESCRIPTION OF A PREFERRED EMBODIMENT

Figure 1:
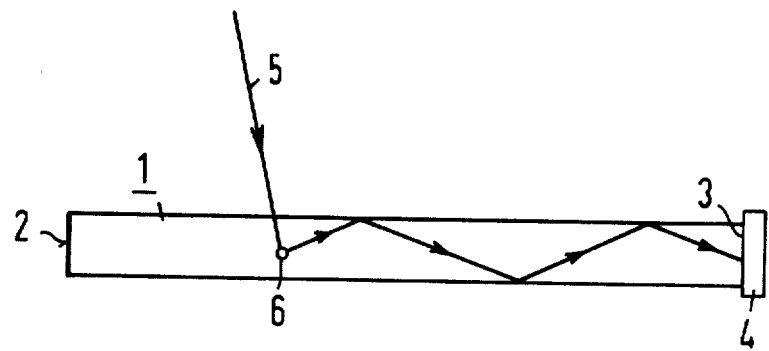
FIG. 1 is a schematic side view of a light collecting device in accordance with the present invention, and FIG. 2 has a schematic structure of a traditional fluorescence-activated display.

The present invention is particularly useful when incorporated into a fluorescent body 1 which has a reflective layer 2 provided on three of its four narrow sides with the fourth side 3 acting as a light exit window and coupled to a solar cell 4. When a beam of ambient light 5 has entered into the body 1 and strikes a fluorescent particle or center 6, the light falling in the absorption range will be absorbed by the center 6. The fluorescence center or particle will then emit light in the emission range which is conducted by means of total reflection within the body to the light exit window formed by the surface 3 to pass into the solar cell 4.

Figure 2:
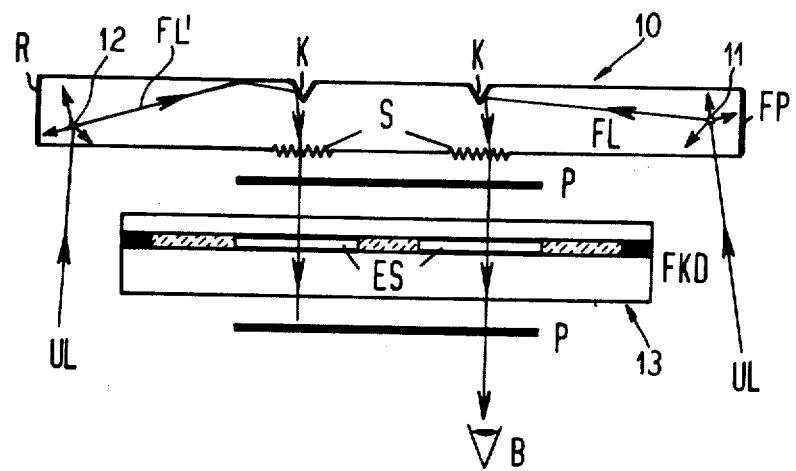

In another embodiment of FIG. 2, a device 10 includes a fluorescent plate or body FP which contains the particle molecules of fluorescent material and the plate receives ambient light UL. When the ambient light strikes a fluorescent center such as 11 and 12, which may be of different particles or pigment, fluorescent light FL and FL' which are of different wave lengths is emitted. Due to the total reflection and the provision of mirrors such as R on the edges of the plate FP, the greatest part of the fluorescent light FL is locked into the plate FP. It is only at the notched locations such as K which are provided with a reflective coating that the fluorescent light is reflected in such a manner that it can leave the plate through an opposite surface. Light-scattering elements S are provided on the opposite surface in alignment with the reflective notches K and combined therewith to form the exit windows. As illustrated, the light scattering elements has served to increase the angle of observation.

In the device 10 of FIG. 2, the plate FP is associated with a standard liquid crystal display 13, which is in a position between the fluorescent plate FP and an observer B. Liquid crystal display 13 consists of two polarizers P and a liquid crystal layer FKD which is located between electrode segments ES which are geometrically located relative to the notches K and the scattering surfaces S and act as controllable light valves for the display.

The invention is not limited to the two above mentioned samples, in particular, the fluorescent body can have a shape other than a strict plate-shape. If one sees to it that the light trap effect is retained on the basis of total reflections, suitable body designs, which are described, for example, in the copending patent application Serial No. 909,553 which issued as U.S. Pat. No. 4,236,791 on Dec. 2, 1980 and was based on German patent application P 27,24,748, can be used.

While most of the plate 1 of FIG. 1 and the plate FP of FIG. 2 are illustrated as rectangular flat plates, it should be realized, that the fluorescent body containing two different particles such as 11 and 12 may be formed of a single plate as described hereinabove or may be a plurality of layers or carriers which are formed into heterogenous subject for the body.

Although various minor modifications may be suggested by those versed in the art, it should be understood that we wish to embody within the scope of the patent granted hereon, all such modifications as reasonably and properly come within the scope of our contribution to the art.

We claim:

1. In a method for collecting light and displaying images, said method comprising providing a display with a body functioning as a light trap, said body containing fluorescent particles having an absorption range amd emitting light in an emission range, said body having at least one light decoupling window aligned with a light valve of the display, said method including absorbing light waves in the absorption range of the particles and emitting light in the emission range, the improvements comprising providing second fluorescent particles having an absorption range and an emission range different than the ranges of said first mentioned particles, and absorbing light in both ranges and emitting light in said two emission ranges.

2. In a method according to claim 1, wherein the absorption range of the second fluorescent particles is a shorter wave length than the absorption range of the first fluorescent particles and the emission range of the second particles is in the absorption range of the first fluorescent particles.

3. In a method according to claim 1, which includes providing third fluorescent particles in the body, said third fluorescent particles absorbing shorter wave length components of the fluorescent light emitted in the first fluorescent particles and said third particles displacing said emitted light to a longer wave length by emitting light with a longer wave length.

4. In a method according to claim 1, wherein the second fluorescent particles have an emission range which overlaps only a small part of the absorption range of the first particles so that the light emitted through the exit windows include light of two distinct ranges.

5. In a method according to claim 1, wherein the body is essentially transparent in the ultraviolet range, and said second particles have an absorption range aligned in the ultraviolet range wherein the step of absorbing by the second particles protects the other particles of the body by absorbing the ultraviolet light and emitting light in a longer wave length.

6. In a method according to claim 5, which includes a step of preventing oxidation by providing oxidation prevention means in the body.

7. In a device for entrapping light and emitting light at a given position in a display at an increased intensity, said device including a display and a body containing a fluorescent particle having an absorption range for wave lengths of light and an emission range for fluorescent light, said body including at least one light exit window aligned with a light valve of said display for decoupling light therethrough, the improvements comprising means for absorbing light from a different range of wave lengths than the light absorption range of the first mentioned fluorescent particles and emitting fluorescent light of a different wave length, said means including second fluorescent particles.

8. In a device according to claim 7, wherein the emission range of a second fluorescent particle lies essentially beyond the absorption range of the first mentioned particles so that light from each emission range is decoupled at the exit windows.

9. In a device according to claim 7, wherein the absorption range of the second fluorescent particles is of a shorter wave length than the absorption range of the first mentioned particles and the emission range of the second particles overlaps at least a portion of the absorption range of the first particles.

10. In a device according to claim 7, which includes a third means for absorbing the shorter wave length component of the fluorescent light of the first fluorescent particles, and emitting light having a longer wave length, said third means being formed by third fluorescent particles.

11. In a device according to claim 7, wherein the second fluorescent particles have the same chemical environment as the first fluorescent particles and are substantially compatible therewith, said body comprising a single carrier body containing both groups of particles.

12. In a device according to claim 7, wherein the concentration of each of the fluorescent particles is selected in such a manner that the wave length range of the ambient light in each of the absorption ranges is absorbed by the respective particles in a range of approximately 90 to 100%.

13. In a device according to claim 7, wherein the concentration of each of the first and second particles is selected to depend on the length of travel of the light in the body and on the life expectancy of the respective particles.

14. In a device according to claim 7, wherein said first fluorescent particles are embedded in a carrier material having additive components and said second fluorescent particles are embedded in a carrier material having different additive components than the additive components for the first fluorescent particles.

15. In a device according to claim 14, wherein the body comprises a different carrier for each of the first and second fluorescent particles.

16. In a device according to claim 15, wherein each of the different carriers is formed into heterogenous structure for said body.

17. In a device according to claim 15, which includes a material having a small index of refraction of $n \approx 1$, being utilized as an additional layer.

18. In a device according to claim 7, wherein the carrier material of the body has a light transparency in the ultraviolet range.

19. In a device according to claim 7, wherein said body includes means for preventing oxidation being added to the carrier material thereof.

20. In a device according to claim 19, wherein a means for preventing oxidation and the reaction products with the oxygen are light transparent for the emission light.

21. In a device according to claim 19, wherein the means for preventing oxidation simultaneously provides polar solvent for the particles in said carrier material.

22. In a device according to claim 7, wherein optical brightners are preferably used as an additional fluorescent substance.

23. In a device according to claim 7, wherein the concentration of the second fluorescent particle is selected in such a manner that it completely absorbs light in the range of 250–400 nm.

24. In a device according to claim 7, wherein the fluorescent body employs a carrier material selected from a group of materials consisting of cellulose derivatives, polyacrylates, polymethacrylates, polystyrenes, polycarbonates, silicone resins with polar groups, a material having a main component consisting of copolymers of styrene and a material having a main component consisting of copolymers of methylmethacrylate.

25. In a device according to claim 24, wherein the cellulose derivatives consists of cellulose-aceto-butyrate.

26. In a device according to claim 7, wherein the body is a plate and wherein fluorescent pigments are provided at a plate edge to change the chrominance of the fluorescent light.

27. In a device according to claim 7, wherein the light decoupling elements consist of fluorescent pigments printed onto the surface of the plate.

28. In a device according to claim 7, wherein the exit windows have a scattering elements and pigments are provided as the scattering elements.

* * * * *